United States Patent
Yang et al.

(10) Patent No.: US 11,239,340 B2
(45) Date of Patent: Feb. 1, 2022

(54) SEMICONDUCTOR ARRANGEMENT AND FORMATION THEREOF

(71) Applicant: Taiwan Semiconductor Manufacturing Company Limited, Hsin-Chu (TW)

(72) Inventors: Tai-I Yang, Hsinchu (TW); Tien-Lu Lin, Hsinchu (TW); Wai-Yi Lien, Hsinchu (TW); Chih-Hao Wang, Baoshan Township (TW); Jiun-Peng Wu, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 16/895,062

(22) Filed: Jun. 8, 2020

(65) Prior Publication Data
US 2020/0303516 A1 Sep. 24, 2020

Related U.S. Application Data

(60) Continuation of application No. 16/240,887, filed on Jan. 7, 2019, now Pat. No. 10,680,078, which is a
(Continued)

(51) Int. Cl.
*H01L 21/02* (2006.01)
*H01L 29/66* (2006.01)
(Continued)

(52) U.S. Cl.
CPC .... *H01L 29/66545* (2013.01); *H01L 21/0214* (2013.01); *H01L 21/0217* (2013.01);
(Continued)

(58) Field of Classification Search
None
See application file for complete search history.

(56) References Cited

U.S. PATENT DOCUMENTS 8,900,944 B2   12/2014   Jeong et al.
9,349,731 B2   5/2016    Kim et al.
(Continued)

FOREIGN PATENT DOCUMENTS

KR   1020120067712 A   6/2012

OTHER PUBLICATIONS

Corresponding Korean Application, Korean Office action dated Dec. 3, 2015, 10 pages. English Translation.

*Primary Examiner* — Bradley Smith
(74) *Attorney, Agent, or Firm* — Cooper Legal Group, LLC

(57) ABSTRACT

A semiconductor arrangement and method of formation are provided. The semiconductor arrangement comprises a conductive contact in contact with a substantially planar first top surface of a first active area, the contact between and in contact with a first alignment spacer and a second alignment spacer both having substantially vertical outer surfaces. The contact formed between the first alignment spacer and the second alignment spacer has a more desired contact shape then a contact formed between alignment spacers that do not have substantially vertical outer surfaces. The substantially planar surface of the first active area is indicative of a substantially undamaged structure of the first active area as compared to an active area that is not substantially planar. The substantially undamaged first active area has a greater contact area for the contact and a lower contact resistance as compared to a damaged first active area.

20 Claims, 8 Drawing Sheets

Related U.S. Application Data continuation of application No. 15/640,635, filed on Jul. 3, 2017, now Pat. No. 10,177,242, which is a continuation of application No. 15/179,054, filed on Jun. 10, 2016, now Pat. No. 9,698,242, which is a division of application No. 14/208,157, filed on Mar. 13, 2014, now Pat. No. 9,373,544.

(51) Int. Cl.
| | | |
|---|---|---|
| *H01L 21/768* | (2006.01) | |
| *H01L 29/49* | (2006.01) | |
| *H01L 29/78* | (2006.01) | |
| *H01L 21/4757* | (2006.01) | |
| *H01L 29/40* | (2006.01) | |

(52) U.S. Cl.
CPC .. *H01L 21/02167* (2013.01); *H01L 21/47573* (2013.01); *H01L 21/76897* (2013.01); *H01L 29/401* (2013.01); *H01L 29/4958* (2013.01); *H01L 29/6656* (2013.01); *H01L 29/66575* (2013.01); *H01L 29/78* (2013.01)

(56) References Cited

U.S. PATENT DOCUMENTS

| | | |
|---|---|---|
| 9,401,359 B2 | 7/2016 | Jeong et al. |
| 10,177,242 B2 | 1/2019 | Yang et al. |
| 2012/0156867 A1 | 6/2012 | Jeong et al. |
| 2014/0035010 A1 | 2/2014 | Cai et al. |
| 2015/0076616 A1 | 3/2015 | Jeong et al. |
| 2015/0118836 A1* | 4/2015 | Lin ................... H01L 21/28247 438/586 |

* cited by examiner

SEMICONDUCTOR ARRANGEMENT AND FORMATION THEREOF

RELATED APPLICATIONS

This application is a continuation of and claims priority to U.S. patent application Ser. No. 16/240,887, titled "SEMICONDUCTOR ARRANGEMENT AND FORMATION THEREOF" and filed on Jan. 7, 2019, which is a continuation of and claims priority to U.S. patent application Ser. No. 15/640,635, titled "SEMICONDUCTOR ARRANGEMENT AND FORMATION THEREOF" and filed on Jul. 3, 2017, which is a continuation of and claims priority to U.S. patent application Ser. No. 15/179,054, titled "SEMICONDUCTOR ARRANGEMENT AND FORMATION THEREOF" and filed on Jun. 10, 2016, which is a divisional of and claims priority to U.S. patent application Ser. No. 14/208,157, titled "SEMICONDUCTOR ARRANGEMENT AND FORMATION THEREOF" and filed on Mar. 13, 2014. U.S. patent application Ser. Nos. 16/240,887, 15/640,635, 15/179,054, and 14/208,157 are incorporated herein by reference.

BACKGROUND

Contacts are used to make electrical connections in or among different features in a semiconductor device. A contact, for example, is used to connect one metal layer to another metal layer or another device layer, where the metal layers are otherwise electrically isolated from one another, such as by an insulating or dielectric material separating the metal layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
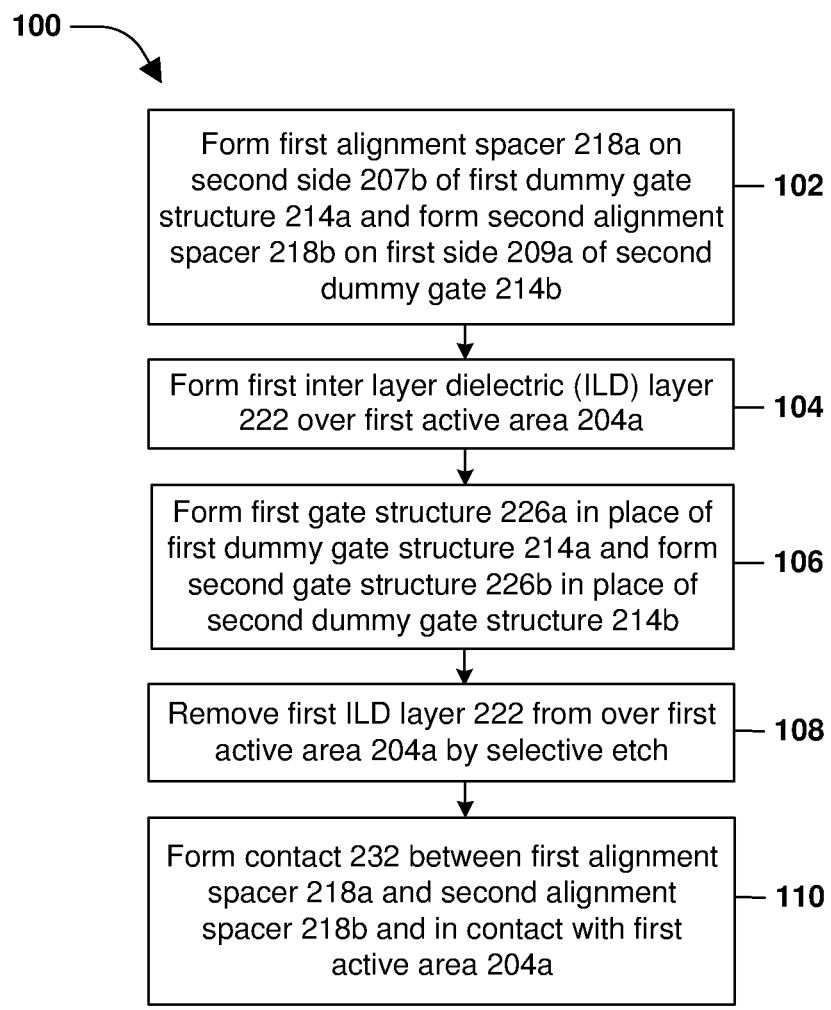
FIG. 1 is a flow diagram illustrating a method of forming a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein.

A method 100 of forming a semiconductor arrangement 200 according to some embodiments is illustrated in FIG. 1 and one or more structures formed thereby at various stages of fabrication are illustrated in FIGS. 2-14. According to some embodiments, such as illustrated in FIG. 14, the semiconductor arrangement 200 comprises a first alignment spacer 218a having a substantially vertical first outer surface 240a on a second side 217b of a first gate structure 226a, where the first outer surface 240a is opposite a first inner surface 240b of the first alignment spacer 218a. In some embodiments, the first inner surface 240b is in contact with the first gate structure 226a. In some embodiments, a second alignment spacer 218b having a substantially vertical second outer surface 242a is on a first side 219a of a second gate structure 226b, where the second outer surface 242a is opposite a second inner surface 242b of the second alignment spacer 218b. In some embodiments, the second inner surface 242b is in contact with the second gate structure 226b. In some embodiments, a conductive contact 232 is in contact with a substantially planar first top surface 236a of a first active area 204a between the first alignment spacer 218a and the second alignment spacer 218b. In some embodiments, the conductive contact 232 formed between the first alignment spacer 218a having the substantially vertical first outer surface 240a and the second alignment spacer 218b having the substantially vertical second outer surface 242a has a more desired contact shape then a contact formed between alignments spacers that do not have substantially vertical outer surfaces. In some embodiments, the substantially planar first top surface 236a of the first active area 204a is indicative of a substantially undamaged structure of the first active area 204a as compared to an active area that is not substantially planar. In some embodiments, the substantially undamaged first active area 204a has a greater contact area for the conductive contact 232, as compared to a damaged first active area. In some embodiments, at least one of the larger contact area of the first active area 204a or the substantially undamaged first active area 204a results in a lower contact resistance between the first active area 204a and the conductive contact 232 as compared to an active area that does not have a larger contact area or is not substantially undamaged. In some embodiments, substantially undamaged is indicative of a substantially uniform lattice structure, such as a lattice structure that has been substantially unaffected by semiconductor processing activities.

Figure 2:
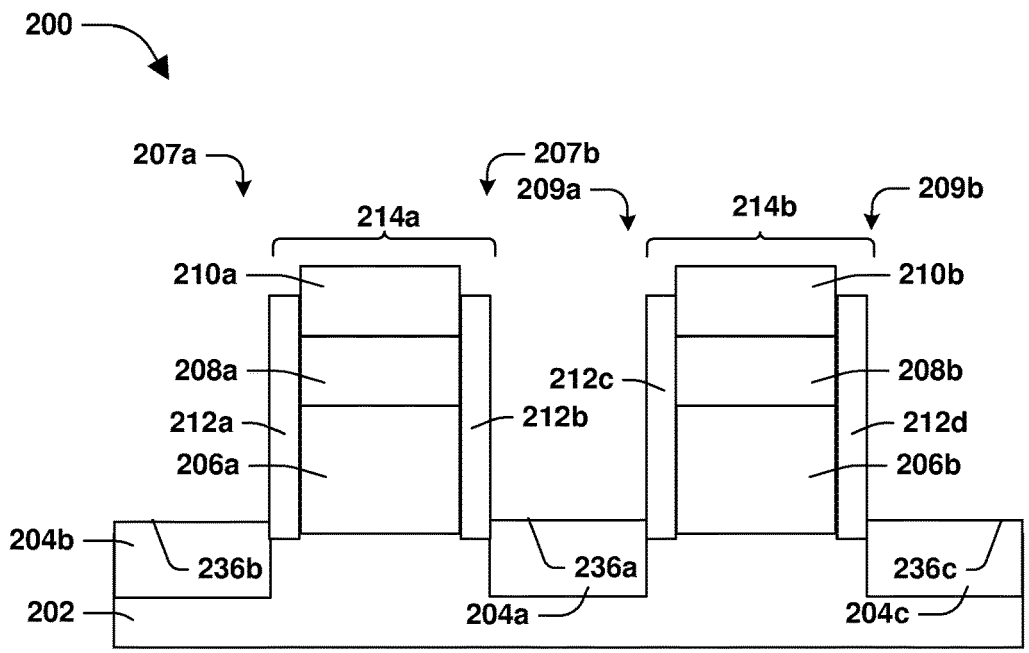
FIG. 2 is an illustration of a semiconductor arrangement, in accordance with some embodiments.
Figure 4:
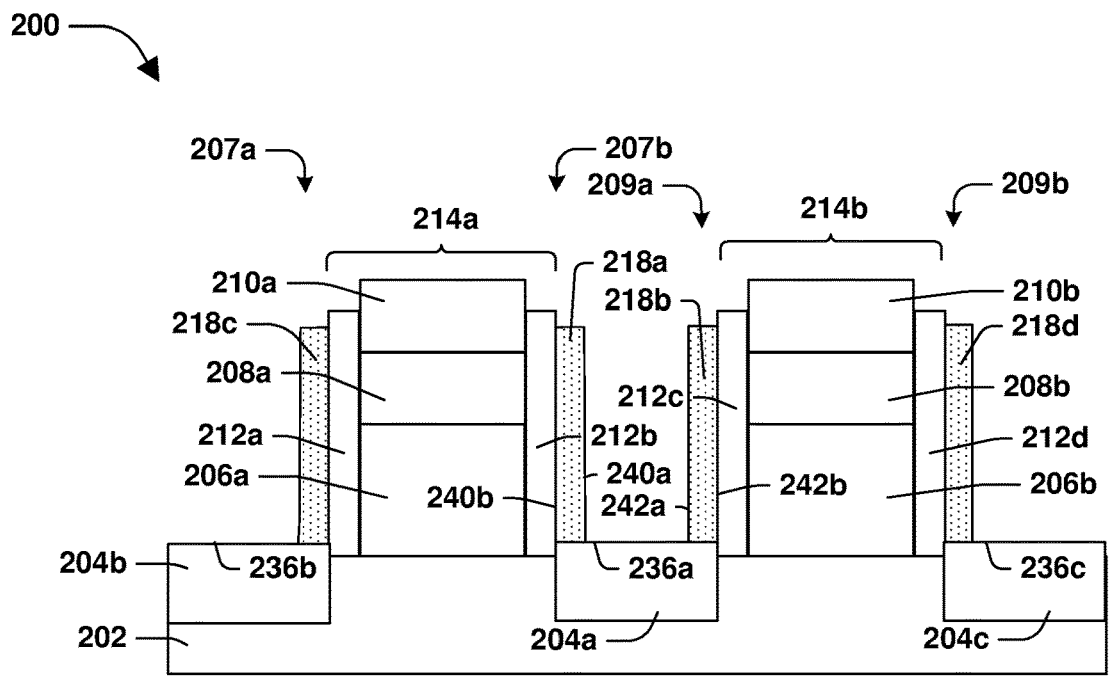
FIG. 4 is an illustration of a semiconductor arrangement, in accordance with some embodiments.

At 102 in FIG. 1, the first alignments spacer 218a is formed on a second side 207b of a first dummy gate structure 214a and the second alignment spacer 218b is formed on a first side 209a of a second dummy gate structure 214b, as illustrated in FIG. 4, according to some embodiments. Turning to FIG. 2, prior to FIG. 4, the semiconductor arrangement 200 comprises a substrate 202, according to some embodiments. In some embodiments, the substrate 202 comprises at least one of silicon or germanium. According to some embodiments, the substrate 202 comprises at least one of an epitaxial layer, a silicon-on-insulator (SOI) structure, a wafer, or a die formed from a wafer. In some embodiments, a first dummy poly 206a is on the substrate 202, an initial first hard mask 208a is over the first dummy poly 206a, and a first oxide mask 210a is over the initial first hard mask 208a. In some embodiments, the first dummy gate structure 214a comprises a first sidewall spacer 212a on a first side 207a of the first dummy poly 206a, the initial first hard mask 208a and the first oxide mask 210a, a second sidewall spacer 212b on the second side 207b of the first dummy poly 206a, the initial first hard mask 208a and the first oxide mask 210a and the first dummy poly 206a, the initial first hard mask 208a and the first oxide mask 210a. In some embodiments, a second dummy poly 206b is adjacent the first dummy gate structure 214a. In some embodiments, an initial second hard mask 208b is over the second dummy poly 206b, and a second oxide mask 210b is over the initial second hard mask 208b. In some embodiments, the second dummy gate structure 214b comprises a third sidewall spacer 212c on the first side 209a of the second dummy poly 206b, the initial second hard mask 208b and the second oxide mask 210b, a fourth sidewall spacer 212d on a second side 209b of the second dummy poly 206b, the initial second hard mask 208b and the second oxide mask 210b and the second dummy poly 206b, the initial second hard mask 208b and the second oxide mask 210b. In some embodiments, at least one of the first dummy poly 206a or the second dummy poly 206b comprises an inactive and non-functional material. In some embodiments, the sidewall spacers 212 comprise at least one of silicon, oxide, or nitride. In some embodiments, at least one of the initial first hard mask 208a or the initial second hard mask 208b comprises at least one of silicon, oxygen, carbon, or nitrogen. In some embodiments, at least one of the first oxide mask 210a or the second oxide mask 210b comprises oxide. In some embodiments, the first active area 204a is between the first dummy gate structure 214a and the second dummy gate structure 214b. In some embodiments, a second active area 204b is on the first side 207a of the first dummy gate structure 214a. In some embodiments, a third active area 204c is on the second side 209b of the second dummy gate structure 214b. In some embodiments, at least one of the first active area 204a, the second active area 204b, or the third active area 204c comprises an epitaxial (Epi) cap. In some embodiments, the Epi caps are formed over fins formed from the substrate 202. In some embodiments, the Epi caps are grown, such that the Epi caps are formed over silicon, such as the silicon in the fins. In some embodiments, at least one of the first active area 204a, the second active area 204b, or the third active area 204c comprises at least one of silicon or germanium. In some embodiments, at least one of a first active area 204a, the second active area 204b, or the third active area 204c comprise at least one of a source or a drain.

Figure 3:
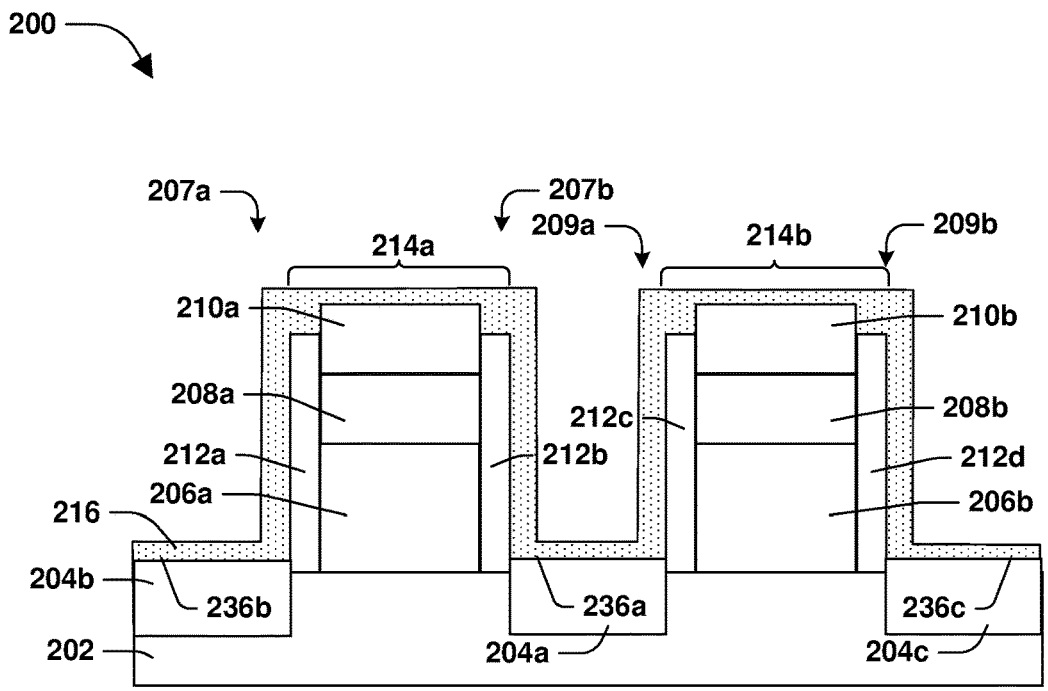
FIG. 3 is an illustration of a semiconductor arrangement, in accordance with some embodiments.

Turning to FIG. 3, a layer of alignment material 216 is formed, such as deposited, over the first active area 204a, the first dummy gate structure 214a, the second active area 204b, the second dummy gate structure 214b, and the third active area 204c, according to some embodiments. In some embodiments, the layer of alignment material 216 has an alignment material width between about 50 nm to about 120 nm. In some embodiments, the layer of alignment material 216 comprises at least one of $Si_3N_4$, SiON, SiCN, or SiOCN. In some embodiments, such as when the layer of alignment material 216 comprises $Si_3N_4$, the layer of alignment material 216 is formed by deposition in a furnace. In some embodiments, the deposition in the furnace occurs in a furnace chamber. In some embodiments, the deposition in the furnace occurs at a furnace temperature between about 600° C. to about 1400° C. In some embodiments, the deposition in the furnace occurs at a furnace pressure between about 100 mTorr to about 300 mTorr. In some embodiments, the deposition in the furnace occurs while introducing a first furnace gas comprising $SiCl_2H_2$ into the furnace chamber at a first furnace flow rate between about 20 sccm to about 60 sccm. In some embodiments, the deposition in the furnace occurs while introducing a second furnace gas comprising $NH_3$ into the furnace chamber at a second furnace flow rate between about 200 sccm to about 300 sccm. In some embodiments, such as when the layer of alignment material 216 comprises at least one of $Si_3N_4$, SiON, SiCN, or SiOCN, the layer of alignment material 216 is formed by chemical vapor deposition (CVD). In some embodiments, the CVD occurs in a CVD chamber. In some embodiments, the CVD occurs at a CVD temperature between about 200° C. to about 400° C. In some embodiments, the CVD occurs at a CVD pressure between about 100 mTorr to about 1000 mTorr. In some embodiments, the CVD occurs while introducing a first CVD gas into the CVD chamber comprising at least one of $SiH_4$ or $SiCl_2H_2$ at a first CVD flow rate between about 500 sccm to about 2000 sccm. In some embodiments, the CVD occurs while introducing a second CVD gas comprising $N_2O$ into the CVD chamber at a second CVD flow rate between about 500 sccm to about 2000 sccm. In some embodiments, the CVD occurs while introducing a third CVD gas comprising at least one of $CO_2$ of $O_2$ into the CVD chamber at a third CVD flow rate between about 100 sccm to about 200 sccm. In some embodiments, the CVD occurs where a CVD plasma power is between about 500 W to about 1000 W. In some embodiments, such as when the layer of alignment material 216 comprises at least one of $Si_3N_4$, SiON, SiCN, or SiOCN, the layer of alignment material 216 is formed by atomic layer deposition (ALD). In some embodiments, the ALD occurs in an ALD chamber. In some embodiments, the ALD occurs at an ALD temperature between about 200° C. to about 400° C. In some embodiments, the ALD occurs at an ALD pressure between about 100 mTorr to about 1000 mTorr. In some embodiments, the ALD occurs while introducing a first ALD gas comprising at least one of $SiH_4$, $Si_xC_y$, or $NH_3$ into the ALD chamber at a first ALD flow rate between about 300 sccm to about 800 sccm. In some embodiments, the ALD occurs while introducing a second ALD gas comprising $O_2$ into the ALD chamber at a second ALD flow rate between about 100 sccm to about 200 sccm. In some embodiments, the ALD occurs where an ALD plasma power is between about 100 W to about 400 W. In some embodiments, a first silicide layer (not shown) is formed over a first top surface 236a of the first active area 204a, a second silicide layer (not shown) is formed over a second top surface 236b of the second active area 204b, and a third silicide layer (not shown) is formed over a third top surface 236c of the third active area 204c. In some embodiments, at least one of the first silicide layer, the second silicide layer, or the third silicide layer is formed during at least one of the ALD, CVD, or deposition in a furnace.

Turning to FIG. 4, the layer of alignment material 216 is removed from the first top surface 236a of the first active area 204a, the second top surface 236b of the second active area 204b, the third top surface 236c of the third active area 204c, a top portion of the first dummy gate structure 214a and a top portion of the second dummy gate structure 214b, according to some embodiments. In some embodiments, the layer of alignment material 216 is removed by a first etch, where the etchant is selective for the layer of alignment material 216, such that the etchant removes little to none of the first active area 204a, the second active area 204b or the third active area 204c. In some embodiments, the first etch leaves the first top surface 236a, the second top surface 236b, and the third top surface 236c substantially planar. In some embodiments, the removal of the layer of alignment material 216 forms the first alignment spacer 218a on the second side 207b of the first dummy gate structure 214a, the second alignment spacer 218b on the first side 209a of the second dummy gate structure 214b, a third alignment spacer 218c on the first side 207a of the first dummy gate structure 214a and a fourth alignment spacer 218d on the second side 209b of the second dummy gate structure 214b. In some embodiments, the first alignment spacer 218a has the substantially vertical first outer surface 240a on the second side 207b of the first dummy gate structure 214a, where the first outer surface 240a is opposite the first inner surface 240b of the first alignment spacer 218a. In some embodiments, the first inner surface 240b is in contact with the first dummy gate structure 214a. In some embodiments, the second alignment spacer 218b has the substantially vertical second outer surface 242a on the first side 209a of the second dummy gate structure 214b, where the second outer surface 242a is opposite the second inner surface 242b of the second alignment spacer 218b. In some embodiments, the second inner surface 242b is in contact with the second dummy gate structure 214b. In some embodiments, the first alignment spacer 218a has a first alignment width between about 50 nm to about 120 nm. In some embodiments, the second alignment spacer 218b has a second alignment width between about 50 nm to about 120 nm. In some embodiments, the third alignment spacer 218c has a third alignment width between about 50 nm to about 120 nm. In some embodiments, the fourth alignment spacer 218d has a fourth alignment width between about 50 nm to about 120 nm.

Figure 5:
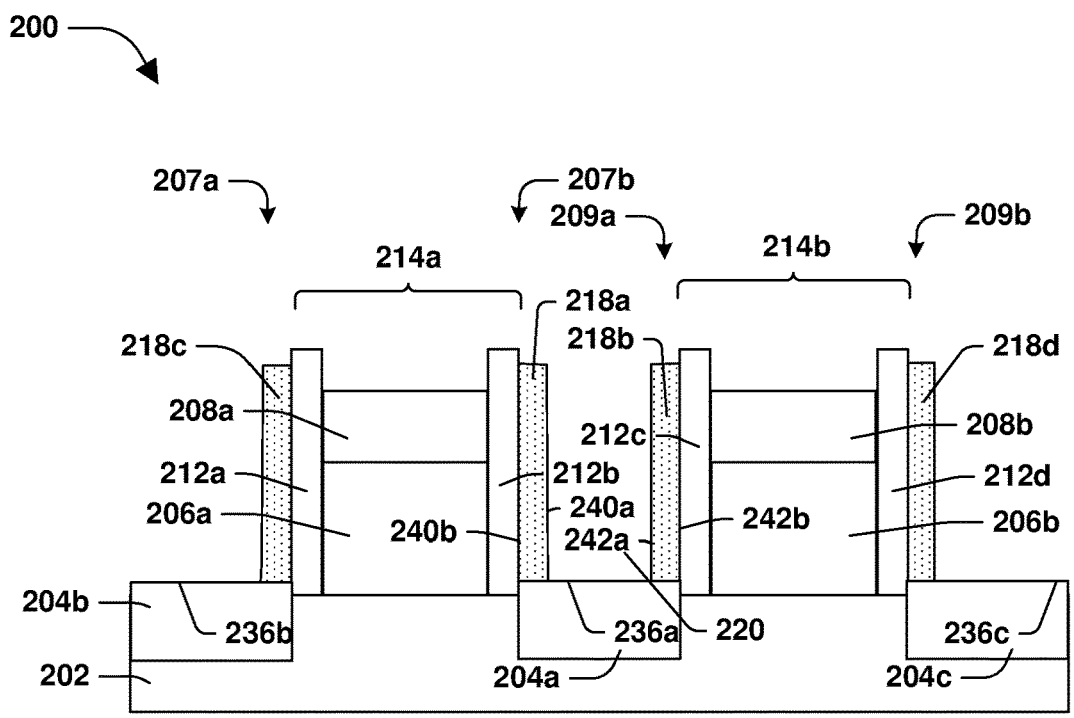
FIG. 5 is an illustration of a semiconductor arrangement, in accordance with some embodiments.
Figure 6:
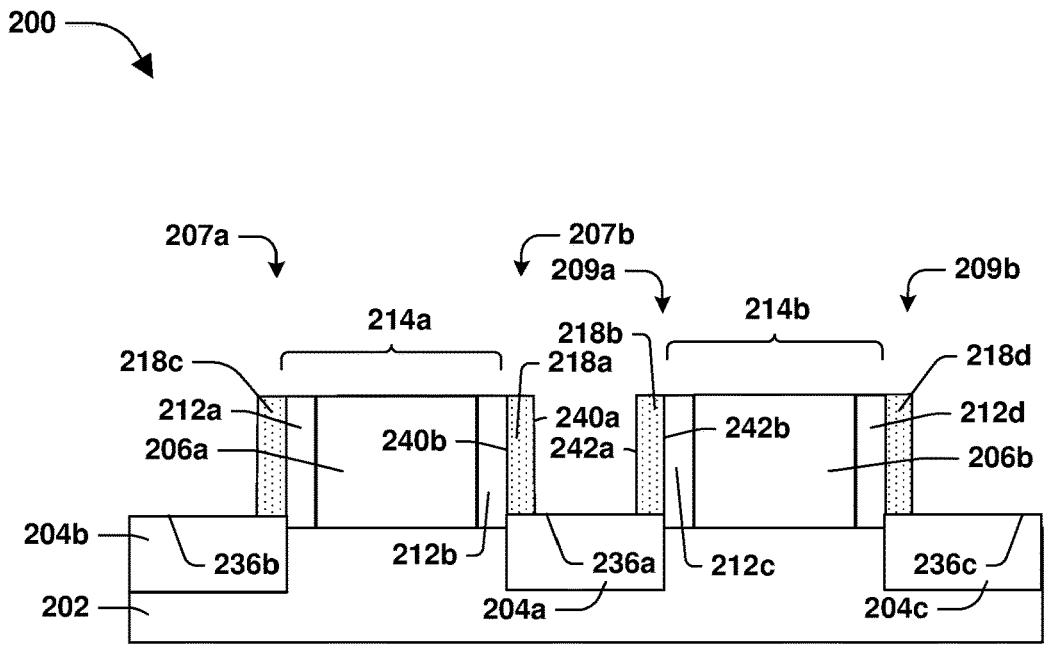
FIG. 6 is an illustration of a semiconductor arrangement, in accordance with some embodiments.

Turning to FIG. 5, the first oxide mask 210a and the second oxide mask 210b are removed, such as by etching, according to some embodiments. In some embodiments, the initial first hard mask 208a, a portion of the first sidewall spacer 212a and a portion of the second sidewall spacer 212b above the first dummy poly 206a, a portion of the first alignment spacer 218a and a portion of the third alignment spacer 218c above the first dummy poly 206a are removed, such as by chemical mechanical planarization (CMP), as illustrated in FIG. 6. In some embodiments, the initial second hard mask 208b, a portion of the third sidewall spacer 212c and a portion of the fourth sidewall spacer 212d above the second dummy poly 206b, and a portion of the second alignment spacer 218b and a portion of the fourth alignment spacer 218d above the second dummy poly 206b are removed, such as by CMP. In some embodiments, the CMP exposes a top surface of the first dummy poly 206a and a top surface of the second dummy poly 206b. In some embodiments, the top surface of the first dummy poly 206a and the top surface of the second dummy poly 206b lie in a first plane. In some embodiments, top surfaces of the third alignment spacer 218c, the first sidewall spacer 212a, the second sidewall spacer 212b, the first alignment spacer 218a, the second alignment spacer 218b, the third sidewall spacer 212c, the fourth sidewall spacer 212d, and the fourth alignment spacer 218d lie in the first plane.

Figure 7:
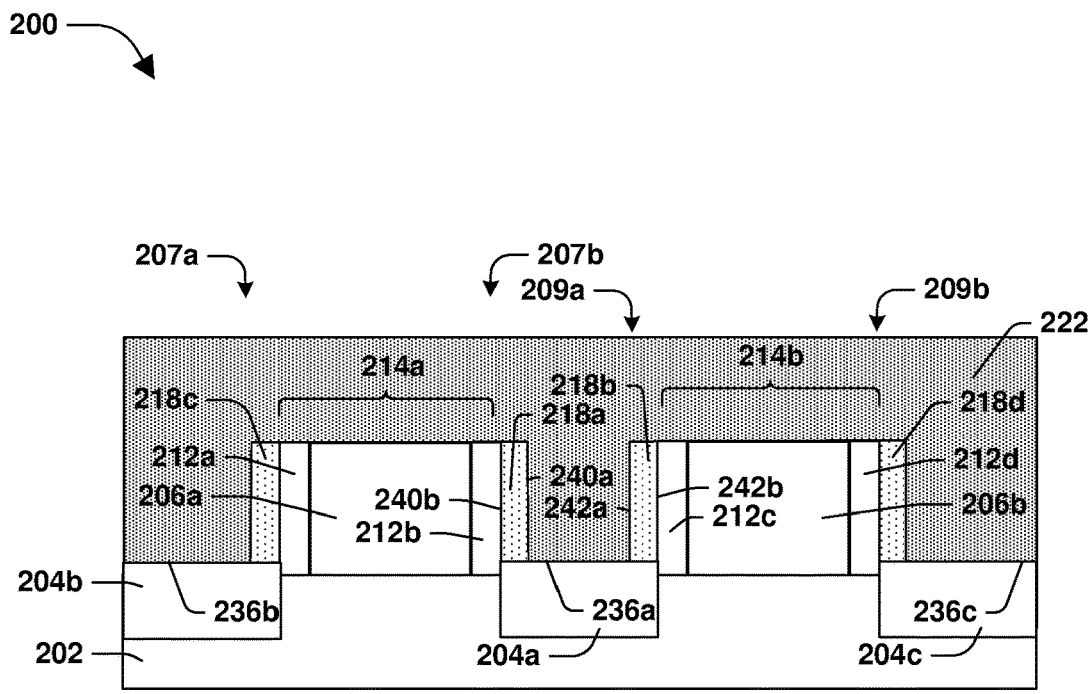
FIG. 7 is an illustration of a semiconductor arrangement, in accordance with some embodiments.
Figure 8:
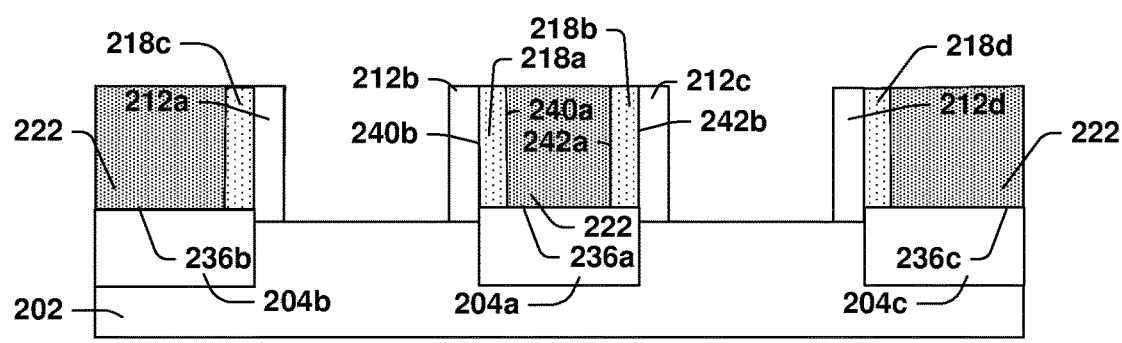
FIG. 8 is an illustration of a semiconductor arrangement, in accordance with some embodiments.

At 104 in FIG. 1, a first inter layer dielectric (ILD) layer 222 is formed over the first active area 204a, as illustrated in FIG. 7, according to some embodiments. In some embodiments, the ILD layer 222 is formed over the second active area 204b, the third alignment spacer 218c, the first dummy gate structure 214a, the first alignment spacer 218a, the second alignment spacer 218b, the second dummy gate structure 214b, the fourth alignment spacer 218d and the third active area 204c. In some embodiments, the ILD layer 222 is formed by deposition. In some embodiments, the ILD layer 222 comprises at least one of oxide or nitride. In some embodiments, a top portion of the ILD layer 222 is removed, such that the top surface of the third alignment spacer 218c, the first sidewall spacer 212a, the dummy poly 206a, the second sidewall spacer 212b, the first alignment spacer 218a, the second alignment spacer 218b, the second dummy poly 206b, the third sidewall spacer 212c, the fourth sidewall spacer 212d, and the fourth alignment spacer 218d are exposed, as illustrated in FIG. 8. In some embodiments, the top portion of the ILD layer 222 is removed by CMP.

With continued reference to FIG. 8, the first dummy poly 206a and the second dummy poly 206b are removed, according to some embodiments. In some embodiments, the first dummy poly 206a and the second dummy poly 206b are removed by etching. In some embodiments, the removal of the first dummy poly 206a and the second dummy poly 206b exposes a top surface of the substrate 202 between the first sidewall spacer 212a and the second sidewall spacer 212b and exposes a top surface of the substrate 202 between the third sidewall spacer 212c and the fourth sidewall spacer 212d.

Figure 9:
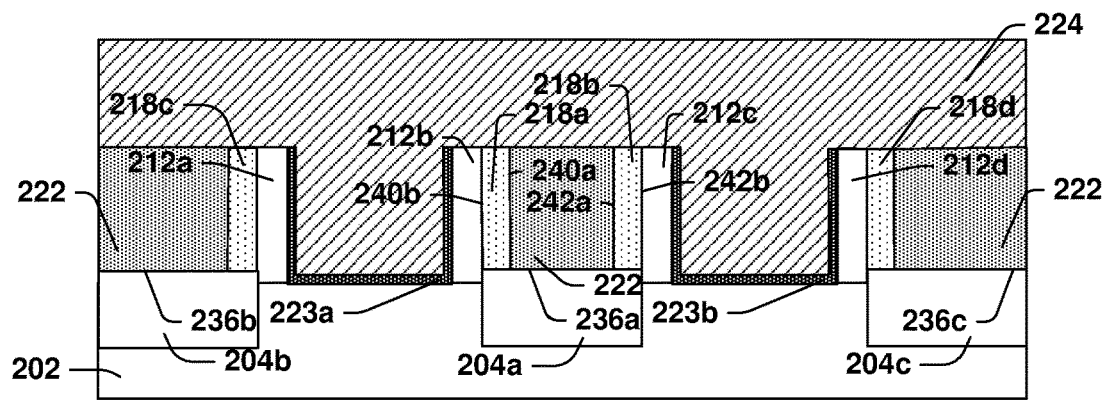
FIG. 9 is an illustration of a semiconductor arrangement, in accordance with some embodiments.
Figure 10:
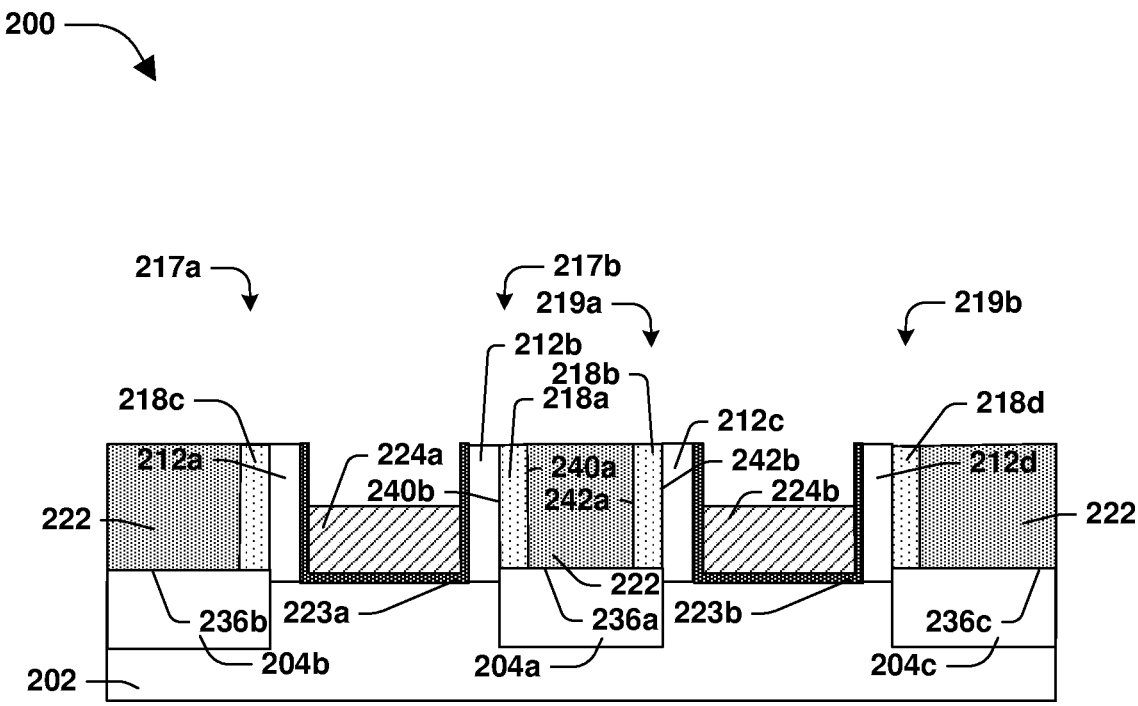
FIG. 10 is an illustration of a semiconductor arrangement, in accordance with some embodiments.
Figure 12:
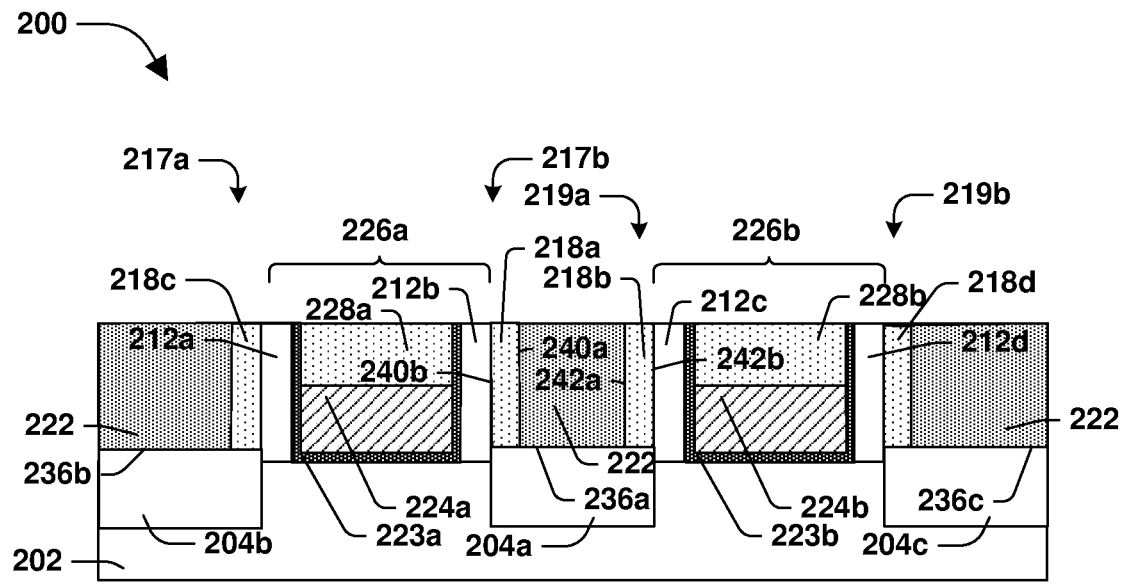
FIG. 12 is an illustration of a semiconductor arrangement, in accordance with some embodiments.

At 106 in FIG. 1, the first gate structure 226a is formed in place of the first dummy gate structure 214a and the second gate structure 226b is formed in place of the second dummy gate structure 214b, as illustrated in FIG. 12, according to some embodiments. Turning to FIG. 9, prior to FIG. 12, a first glue layer 223a is formed over the top surface of the substrate 202 between the first sidewall spacer 212a and the second sidewall spacer 212b, on a sidewall of the first sidewall spacer 212a and on a sidewall of the second sidewall spacer 212b. In some embodiments, a second glue layer 223b is formed over the top surface of the substrate 202 between the third sidewall spacer 212c and the fourth sidewall spacer 212d, on a sidewall of the third sidewall spacer 212c and on a sidewall of the fourth sidewall spacer 212d. In some embodiments, the first glue layer 223a and the second glue layer 223b comprise at least one of titanium or nitride. In some embodiments, at least one of the first glue layer 223a or the second glue layer 223b have a thickness between about 30 Å to about 150 Å. In some embodiments, a layer of gate electrode material 224 is formed over the ILD layer 222, the sidewall spacers 212, the alignment spacers 218, the first glue layer 223a, and the second glue layer 223b. In some embodiments, the layer of gate electrode material 224 comprises a metal, such as at least one of tungsten, aluminum, titanium, or cobalt. In some embodiments, a top portion of the layer of gate electrode material 224 is removed, such as by CMP, to expose the top surface of the third alignment spacer 218c, the first sidewall spacer 212a, the first glue layer 223a, the second sidewall spacer 212b, the first alignment spacer 218a, the second alignment spacer 218b, the third sidewall spacer 212c, the second glue layer 223b, the fourth sidewall spacer 212d, and the fourth alignment spacer 218d, as illustrated in FIG. 10.

With continued reference to FIG. 10, a first height of the layer of gate electrode material 224 over the first glue layer 223a is reduced, such that a top surface of the layer of gate material is below the top surface of the first glue layer 223a, forming the first gate electrode 224a, according to some embodiments. In some embodiments, a second height of the layer of gate electrode material 224 over the second glue layer 223b is reduced, such that a top surface of the layer of gate electrode material 224 is below the top surface of the second glue layer 223b, forming the second gate electrode 224b.

Figure 11:
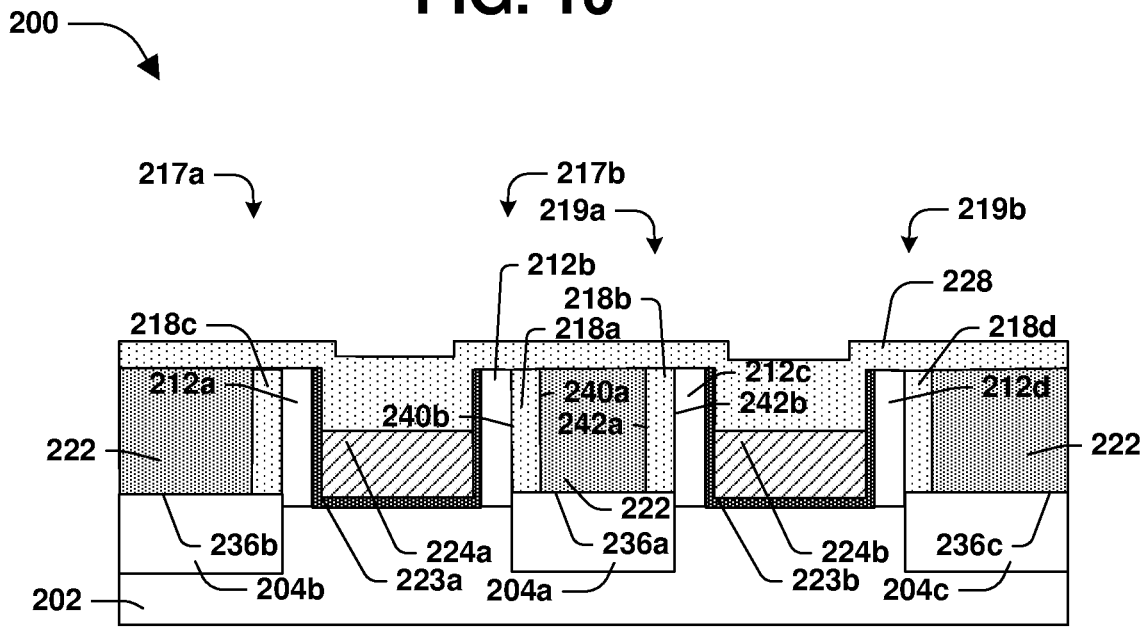
FIG. 11 is an illustration of a semiconductor arrangement, in accordance with some embodiments.

Turning to FIG. 11, a layer of hard mask material 228 is formed over the ILD layer 222, the third alignment spacer 218c, the first sidewall spacer 212a, the first glue layer 223a, the first gate electrode 224a the second sidewall spacer 212b, the first alignment spacer 218a, the second alignment spacer 218b, the third sidewall spacer 212c the second glue layer 223b, the second gate electrode 224b, the fourth sidewall spacer 212d, and the fourth alignment spacer 218d. In some embodiments, the layer of hard mask material 228 is formed by deposition. In some embodiments, the layer of hard mask material 228 comprises at least one of $Si_3N_4$, SiON, SiCN, or SiOCN.

Turning to FIG. 12, a top portion of the layer of hard mask material 228 is removed, such as by CMP, forming a first hard mask 228a over the first gate electrode 224a and forming a second hard mask 228b over the second gate electrode 224b. In some embodiments, the first gate structure 226a comprises the first sidewall spacer 212a, the first glue layer 223a, the first gate electrode 224a, the first hard mask 228a, and the second sidewall spacer 212b. In some embodiments, the second gate structure 226b comprises the third sidewall spacer 212c, the second glue layer 223b, the second gate electrode 224b, the second hard mask 228b, and the fourth sidewall spacer 212d. In some embodiments, the removal of the top portion of the layer of hard mask material 228 exposes top surfaces of the ILD layer 222, the third alignment spacer 218c, the first sidewall spacer 212a, the first glue layer 223a, the second sidewall spacer 212b, the first alignment spacer 218a, the second alignment spacer 218b, the third sidewall spacer 212c, the second glue layer 223b, the fourth sidewall spacer 212d, and the fourth alignment spacer 218d, according to some embodiments.

Figure 13:
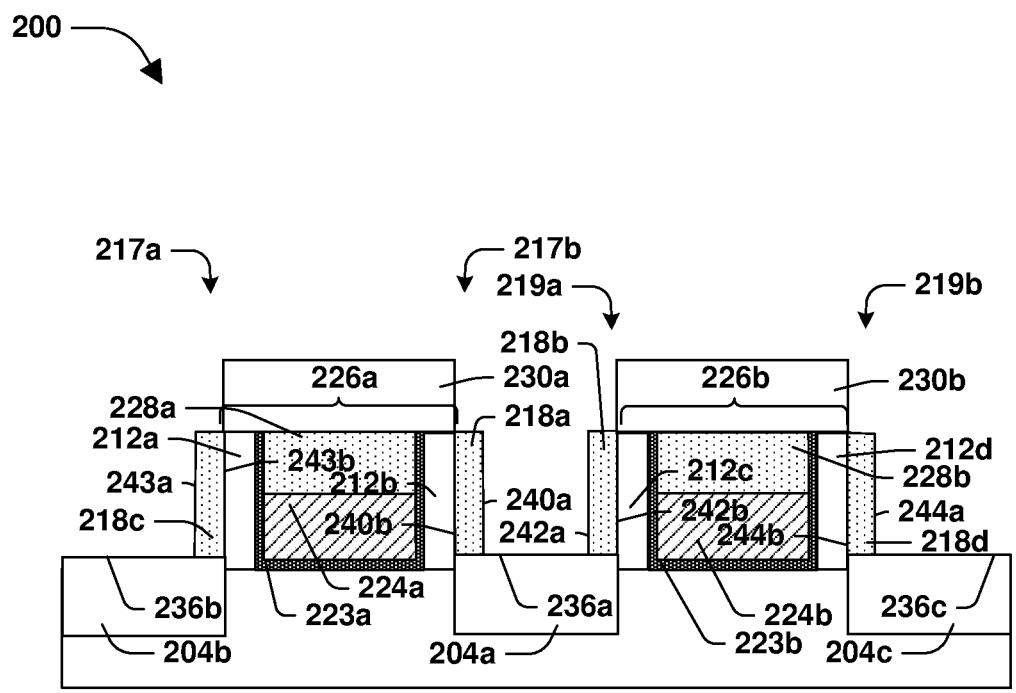
FIG. 13 is an illustration of a semiconductor arrangement, in accordance with some embodiments.
Figure 14:
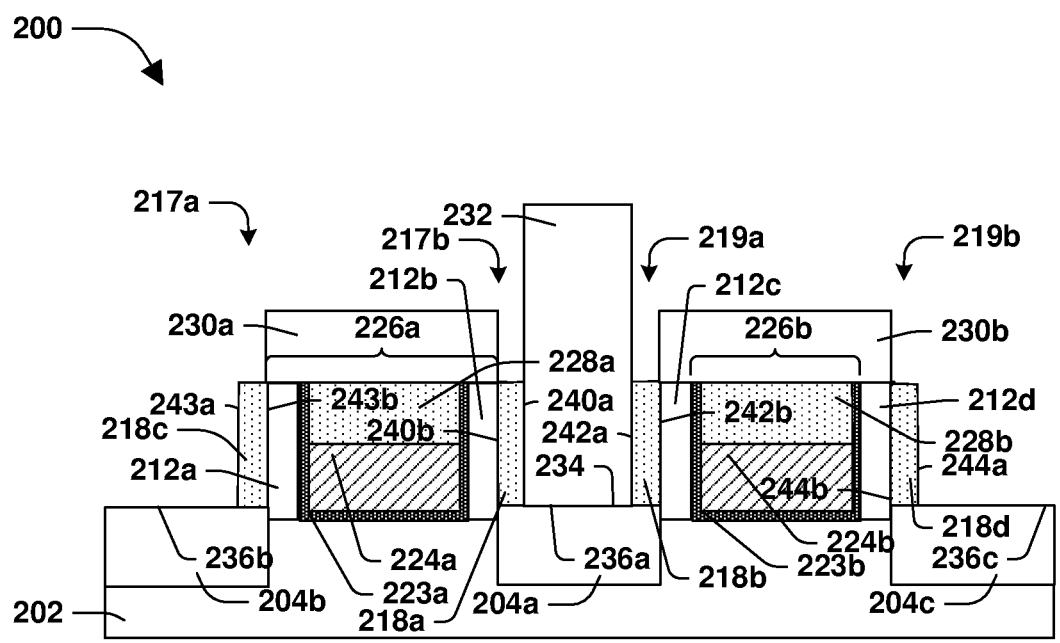
FIG. 14 is an illustration of a semiconductor arrangement, in accordance with some embodiments.

Turning to FIG. 13, a first ILD cap 230a is formed over the first gate structure 226a and a second ILD cap 230b is formed over the second gate structure 226b, according to some embodiments. In some embodiments, at least one of the first ILD cap 230a or the second ILD cap 230b is formed by deposition. In some embodiments, at least one of the first ILD cap 230a or the second ILD cap 230b comprises at least one of nitride or oxide.

At 108 in FIG. 1, the ILD layer 222 is removed from over the first active area 204a by a selective etch, as illustrated in FIG. 13, according to some embodiments. In some embodiments, the ILD layer 222 is removed from over the second active area 204b and the third active area 204c by selective etch. In some embodiments, the selective etch causes little to no damage to at least one of the first active area 204a, the second active area 204b, or the third active area 204c. In some embodiments, after the selective etch the first alignment spacer 218a has a substantially vertical first outer surface 240a on the second side 217b of the first gate structure 226a, where the first outer surface 240a is opposite the first inner surface 240b of the first alignment spacer 218a. In some embodiments, after the selective etch the second alignment spacer 218b has a substantially vertical second outer surface 242a on the first side 219a of the second gate structure 226b, where the second outer surface 242a is opposite the second inner surface 242b of the second alignment spacer 218b. In some embodiments, after the selective etch the third alignment spacer 218c has a substantially vertical third outer surface 243a on a first side 217a of the first gate structure 226a, where the third outer surface 243a is opposite a third inner surface 243b of the third alignment spacer 218c. In some embodiments, the third inner surface 243b is in contact with the first gate structure 226a. In some embodiments, after the selective etch the fourth alignment spacer 218d has a substantially vertical fourth outer surface 244a on a second side 219b of the second gate structure 226b, where the fourth outer surface 244a is opposite the fourth inner surface 244b of the fourth alignment spacer 218d. In some embodiments, the fourth inner surface 244b is in contact with the second gate structure 226b.

At 110 in FIG. 1, the conductive contact 232 is formed between the first alignment spacer 218a and the second alignment spacer 218b, such that the conductive contact 232 is in contact with the first top surface 236a of the first active area 204a, as illustrated in FIG. 14. In some embodiments, the conductive contact 232 comprises metal. In some embodiments, the first alignment spacer 218a and the second alignment spacer 218b align the conductive contact 232 such that the conductive contact 232 is formed over and in contact with the first active area 204a. In some embodiments, the conductive contact 232 formed between the first alignment spacer 218a having the substantially vertical first outer surface 240a and the second alignment spacer 218b having the substantially vertical second outer surface 242a has a more desired contact shape then a contact formed between alignments spacers that do not have substantially vertical outer surfaces. In some embodiments, the substantially planar first top surface 236a of the first active area 204a is indicative of a substantially undamaged structure of the first active area 204a as compared to an active area that is not substantially planar. In some embodiments, the substantially undamaged first active area 204a has a greater contact area for the conductive contact 232, as compared to a damaged first active area. In some embodiments, at least one of the larger contact area of the first active area 204a or the substantially undamaged first active area 204a results in a lower contact resistance between the first active area 204a and the conductive contact 232 as compared to an active area that does not have a larger contact area or is not substantially undamaged. In some embodiments, substantially undamaged is indicative of a substantially uniform lattice structure, such as a lattice structure that has been substantially unaffected by semiconductor processing activities.

According to some embodiments, a semiconductor arrangement comprises a first alignment spacer having a substantially vertical first outer surface on a second side of a first gate structure, where the first outer surface is opposite a first inner surface of the first alignment spacer. In some embodiments, the first inner surface is in contact with the first gate structure. In some embodiments, a second alignment spacer having a substantially vertical second outer surface is on a first side of a second gate structure, where the second outer surface is opposite a second inner surface of the second alignment spacer. In some embodiments, the second inner surface is in contact with the second gate structure. In some embodiments, a conductive contact in contact with a substantially planar surface of a first active area is between the first alignment spacer and the second alignment spacer.

According to some embodiments, a method of forming a semiconductor arrangement comprises forming a first alignment spacer on a second side of a first dummy gate structure and forming a second alignment spacer on a first side of a second dummy gate structure, such that a first active area is between the first alignment spacer and the second alignment spacer. According to some embodiments, the method of forming a semiconductor arrangement further comprises forming a first inter layer dielectric (ILD) layer over the first active area, forming a first gate structure in place of the first dummy gate structure, and forming a second gate structure in place of the second dummy gate structure. According to some embodiments, the method of forming a semiconductor arrangement further comprises removing the first ILD layer from over the first active area by selective etch, such that the first active area has a substantially planar surface.

According to some embodiments, a semiconductor arrangement comprises a first alignment spacer having a substantially vertical first outer surface on a second side of a first gate structure, where the first outer surface is opposite a first inner surface, the first inner surface in contact with the first gate structure and a second alignment spacer having a substantially vertical second outer surface is on a first side of a second gate structure where the second outer surface is opposite a second inner surface, the second inner surface in contact with the second gate structure. In some embodiments, a third alignment spacer having a substantially vertical third outer surface is on a first side of the first gate structure, where the third outer surface is opposite a third inner surface, the third inner surface in contact with the first gate structure. In some embodiments, a fourth alignment spacer having a substantially vertical fourth outer surface is on a second side of the second gate structure where the fourth outer surface is opposite a fourth inner surface, the fourth inner surface in contact with the second gate structure. In some embodiments, a contact is in contact with a first active area between the first alignment spacer and the second alignment spacer, where the first active area has little to no surface damage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor structure, comprising:
   a source/drain region;
   a first spacer overlying the source/drain region;
   a gate structure comprising:
      a gate electrode;
      a hard mask over the gate electrode; and
      a second spacer, wherein:
         the second spacer is between the gate electrode and the first spacer,
         the second spacer is between the hard mask and the first spacer,
         the first spacer comprises a first material composition, and
         the second spacer comprises a second material composition different than the first material composition; and
   a conductive contact overlying the source/drain region, wherein:
      the first spacer is between the conductive contact and the second spacer, and
      the hard mask is spaced apart from the conductive contact.

2. The semiconductor structure of claim 1, wherein the second spacer has a first height and the first spacer has a second height different than the first height.

3. The semiconductor structure of claim 2, wherein the second height is less than the first height.

4. The semiconductor structure of claim 1, wherein the first material composition comprises at least one of $Si_3N_4$, SiON, SiCN, or SiOCN.

5. The semiconductor structure of claim 1, comprising an interlayer dielectric (ILD) cap overlying the hard mask and the second spacer.

6. The semiconductor structure of claim 5, wherein the ILD cap is spaced apart from the conductive contact.

7. The semiconductor structure of claim 1, comprising a glue layer, wherein the gate electrode is over the glue layer.

8. The semiconductor structure of claim 7, wherein the glue layer is between the gate electrode and the second spacer.

9. The semiconductor structure of claim 8, wherein the glue layer is between the hard mask and the second spacer.

10. The semiconductor structure of claim 7, wherein the glue layer is between the hard mask and the second spacer.

11. The semiconductor structure of claim 1, comprising: a glue layer between the hard mask and the first spacer.

12. The semiconductor structure of claim 1, wherein the conductive contact is spaced apart from the hard mask by the second spacer.

13. The semiconductor structure of claim 1, wherein the conductive contact is spaced apart from the hard mask by the first spacer.

14. A semiconductor structure, comprising:
    a source/drain region;
    a first spacer overlying the source/drain region;
    a gate structure comprising:
       a gate electrode;
       a hard mask over the gate electrode;
       a layer between the hard mask and the first spacer; and
       a second spacer, wherein:
          the second spacer is between the gate electrode and the first spacer,
          the second spacer is between the hard mask and the first spacer,
          the first spacer comprises a first material composition, and
          the second spacer comprises a second material composition different than the first material composition; and
    a conductive contact overlying the source/drain region, wherein the first spacer is between the conductive contact and the second spacer.

15. The semiconductor structure of claim 14, wherein the layer is a glue layer.

16. The semiconductor structure of claim 14, wherein the conductive contact is spaced apart from the hard mask by the second spacer.

17. The semiconductor structure of claim 14, wherein the conductive contact is spaced apart from the hard mask by the first spacer.

18. A semiconductor structure, comprising:
    a source/drain region;
    a first spacer over the source/drain region;
    a gate structure comprising:
       a gate electrode;
       a hard mask over the gate electrode; and
       a second spacer, wherein:
          the second spacer is between the gate electrode and the first spacer,
          the second spacer is between the hard mask and the first spacer,
          the first spacer comprises a first material composition, and
          the second spacer comprises a second material composition different than the first material composition; and
    a conductive contact electrically coupled to the source/drain region, wherein:
       the first spacer is between the conductive contact and the second spacer, and
       the hard mask is spaced apart from the conductive contact.

19. The semiconductor structure of claim 18, wherein the second spacer has a first height and the first spacer has a second height different than the first height.

20. The semiconductor structure of claim 18, comprising a glue layer, wherein the glue layer is between the gate electrode and the second spacer.

* * * * *